United States Patent [19]

Choi et al.

[11] Patent Number: 5,629,238

[45] Date of Patent: May 13, 1997

[54] METHOD FOR FORMING CONDUCTIVE LINE OF SEMICONDUCTOR DEVICE

[75] Inventors: Ji-hyun Choi; Hong-jae Shin, both of Seoul; Byung-keun Hwang; U-in Chung, both of Kyungki, all of Rep. of Korea

[73] Assignee: Samsung Electronics Co., Ltd., Suwon, Rep. of Korea

[21] Appl. No.: 557,534

[22] Filed: Nov. 14, 1995

[30] Foreign Application Priority Data

Nov. 30, 1994 [KR] Rep. of Korea ............. 94-32131

[51] Int. Cl.$^6$ .................. H01L 21/283; H01L 21/316
[52] U.S. Cl. .................. 438/645; 438/702; 438/696; 438/672
[58] Field of Search .................. 437/187, 189, 437/194, 195, 238, 239, 240, 228 S, 228 POL, 228 PL; 257/752, 758, 760

[56] References Cited

U.S. PATENT DOCUMENTS

| | | | |
|---|---|---|---|
| 5,137,597 | 8/1992 | Curry, II et al. | 156/636 |
| 5,219,792 | 6/1993 | Kim et al. | 437/195 |
| 5,334,552 | 8/1994 | Homma | 437/195 |
| 5,429,995 | 7/1995 | Nishiyama et al. | 437/238 |
| 5,444,019 | 8/1995 | Chen et al. | 437/192 |
| 5,468,682 | 11/1995 | Homma | 437/195 |

*Primary Examiner*—T. N. Quach
*Attorney, Agent, or Firm*—Cushman Darby & Cushman, IP Group of Pillsbury Madison & Sutro LLP

[57] ABSTRACT

A method for forming a conductive line uses a fluorine doped oxide layer as an insulating layer between conductive lines. The method comprises the steps of: (a) forming a fluorine doped oxide layer on a semiconductor substrate on which a lower structure is formed; (b) etching the oxide layer of the region where a conductive line is to be formed, thereby forming a trench; (c) forming an insulating layer on the overall surface of the resultant substrate; depositing conductive material on the resultant substrate; and (e) etching back the conductive material so that the conductive material is left on the trench only, thereby forming a conductive line. In this method, the conductive line is formed of aluminum-containing material and the insulating layer is formed of silicon dioxide. In the present invention, the insulating layer is interposed between the fluorine doped oxide layer and the aluminum-containing conductive line and thus the conductive line is free from corrosion.

14 Claims, 6 Drawing Sheets

METHOD FOR FORMING CONDUCTIVE LINE OF SEMICONDUCTOR DEVICE

BACKGROUND OF THE INVENTION

The present invention relates to a method for manufacturing a semiconductor device. More particularly, the present invention relates to a method for forming a conductive line using a fluorine doped oxide layer (hereinafter "SiOF layer") as an insulating layer formed between conductive layers.

As semiconductor devices have been more highly integrated, the spacing between conductive lines has been reduced, as well as the dimension of the conductive lines themselves. The reduction in space between conductive lines is becoming a major cause of parasitic capacitance. Therefore, it has become highly desirable to develop insulating material having a lower dielectric constant than that of the generally used insulating materials.

The fluorine doped oxide layer (i.e., SiOF layer) was developed as an insulating material for reducing parasitic capacitance between conductive lines.

FIG. 1 is a sectional view representing conductive lines separated by a fluorine doped oxide layer formed by one method of the prior art. In FIG. 1, reference numeral 10 denotes a semiconductor substrate, 12 denotes a first insulating layer, 14 denotes conductive lines, and 16 denotes a SiOF layer.

Insulating material such as silicon dioxide ($SiO_2$) is coated on semiconductor substrate 10 to form first insulating layer 12. Then, metal material such as aluminum is deposited thereon and the resultant substrate is then patterned to form conductive lines 14. Thereafter, SiOF is coated on the overall surface of the resultant substrate to form SiOF layer 16.

As shown in FIG. 1, SiOF layer 16 is used as an interlevel insulating layer, conductive lines 14 are formed by the general depositing/etching process and SiOF layer 16 is formed by chemical vapor deposition (CVD).

In the resultant substrate, SiOF is used as a material for insulating between conductive lines thereby improving the insulation characteristic. However, when SiOF layer 16 is formed after forming conductive lines 14, the fluorine concentration of the SiOF layer in region B between the conductive lines, is differently distributed from that in region A.

This deteriorates the characteristic of the SiOF layer which is intended to function as an effective dielectric layer with a low dielectric constant. Therefore, a novel method for forming conductive lines is needed to avoid the above-mentioned problem.

FIGS. 2A through 2C are sectional views for sequentially illustrating a method for forming conductive lines according to another method in the prior art. According to this method, fluorine is uniformly distributed over the whole layer by forming flattened SiOF layer 16.

When the SiOF layer is formed on the flat lower structure, it has a uniform distribution of fluorine. Therefore, the SiOF layer is first coated and flattened on the flat lower structure and then the conductive lines are formed.

After forming SiOF layer 16 on semiconductor substrate 10 (FIG. 2A), part of the SiOF layer 16 where the conductive lines are to be formed is partially removed to form trenches 1. Metal material 18 such as aluminum is deposited on the overall surface of the resultant substrate (FIG. 2B). The metal material is then etched back until the surface of the SiOF layer 16 is exposed, forming conductive lines 20 which plug trenches 1.

According to the above-described method, after forming the flattened SiOF layer 16, trenches 1 are formed therein and conductive lines 20 are then formed plugging trenches. This method overcomes the problem in which the SiOF layer's characteristic deteriorates due to unevenness in the fluorine distribution. However, when an aluminum-containing material is used for constituting the conductive lines, there is a disadvantage in that the aluminum reacts with the SiOF layer, thereby causing corrosion of the conductive lines.

Therefore, there is needed a method for forming a conductive line which is free from corrosion as well as prevents unevenness in the fluorine distribution in the SiOF layer.

SUMMARY OF THE INVENTION

An object of the present invention is to provide a method for forming a conductive line of a semiconductor device which is free from corrosion caused by the reaction of the dielectric layer, with a low dielectric constant, and the conductive lines.

To achieve the above object of the present invention, there is provided a method for forming a conductive line comprising the steps of: (a) forming a fluorine doped oxide layer on a lower structure; (b) etching the oxide layer of the region where a conductive line is to be formed to form a trench; (c) forming an insulating layer on the overall surface of the resultant substrate; (d) depositing conductive material on the resultant substrate; and (e) etching back the conductive material so that the conductive material is only left in the trench thereby forming a conductive line.

In step (e), it is preferred that the etch back process is performed by chemical mechanical polishing (CMP) until the surface of the insulating layer or the fluorine doped oxide layer is exposed.

It is preferred that the step of anisotropically etching the insulating layer to form a spacer on the side wall of the trench is performed after step (c).

It is preferred that the lower structure allow for an insulating material layer to be formed on the semiconductor substrate on which a lower conductive line is to be formed or an impurity layer is to be formed. At this time, it is preferred that the step of partially etching the insulating material layer underlying the trench to expose the lower conductive line or the impurity layer is performed after step (c).

It is preferred that the conductive material is a material which reacts with the fluorine doped oxide layer to cause corrosion and, more preferably, that aluminum be used as the conductive material.

It is preferred that the insulating layer is silicon dioxide or boro-phosphorus doped silicate glass (BPSG).

To achieve the above object of the present invention, there is provided a method for forming a conductive line of a semiconductor device comprising the steps of: (a) forming an insulating material layer on a semiconductor substrate on which a lower conductive line is formed or in which an impurity layer is formed; (b) forming a contact hole for exposing the lower conductive line or the impurity layer; (c) depositing first conductive material on the overall surface of the resultant substrate; (d) etching back the first conductive material to form a plug layer for filling the contact hole; (e) forming a fluorine doped oxide layer on the overall surface of the resultant substrate; (f) etching the oxide layer so that the plug layer is completely exposed to form a trench; (g) forming an insulating layer on the overall surface of the resultant substrate; (h) anisotropically etching the insulating layer to form a spacer on the side wall of the trench; (i) depositing second conductive material on the resultant substrate; and (j) etching back the second conductive material so that the second conductive material is only left in the trench thereby forming a conductive line.

According to the present invention, it is preferred that the first conductive material includes tungsten, aluminum, tungsten nitride, titanium or titanium nitride.

It is preferred that the second conductive material is a material which reacts with the oxide layer to cause corrosion. Aluminum is preferably used as the second conductive material.

According to the method for forming a conductive line of the present invention, a flattened SiOF layer is formed and an insulating layer is interposed between the SiOF layer and the aluminum-containing conductive line, thereby attaining the following advantages: first, deterioration of the SiOF layer's due to uneven distribution of fluorine is prevented; and second, corrosion caused by the reaction of the SiOF layer and the conductive line is prevented.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

First Embodiment

Figure 1:
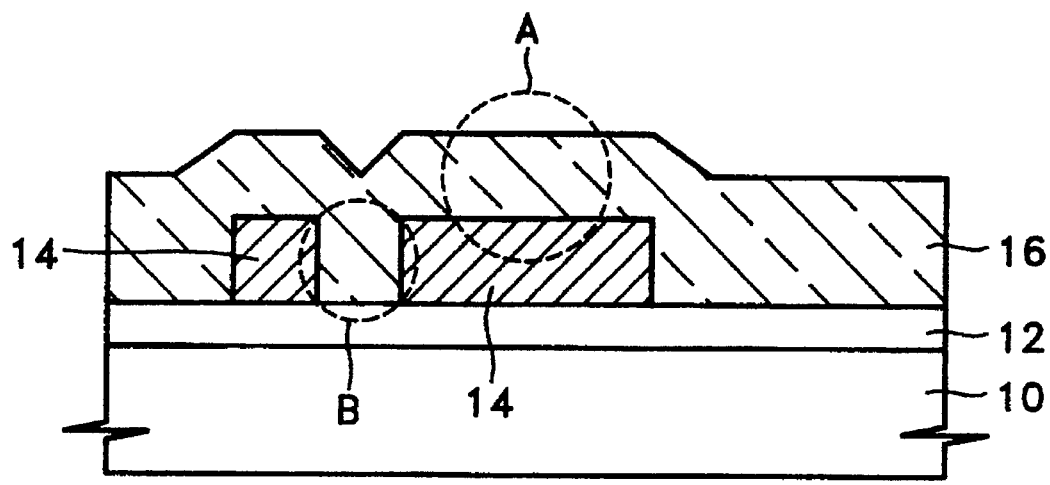
FIG. 1 is a sectional view showing conductive lines and a fluorine doped interlayer oxide layer formed by a conventional method.
Figure 2A:
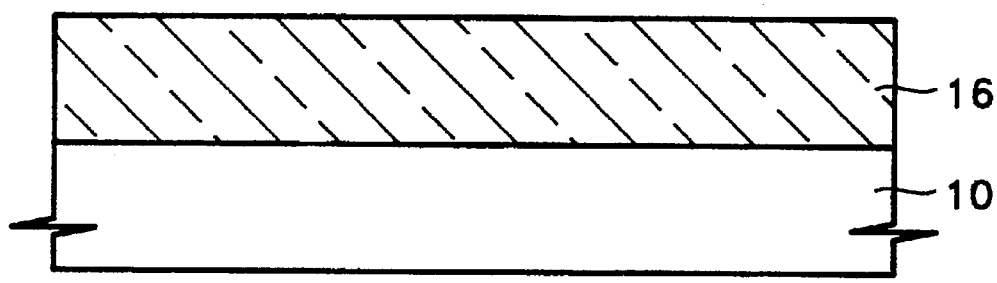
FIGS. 2A through 2C are sectional views for sequentially illustrating another conventional method for forming a conductive line.
Figure 2B:
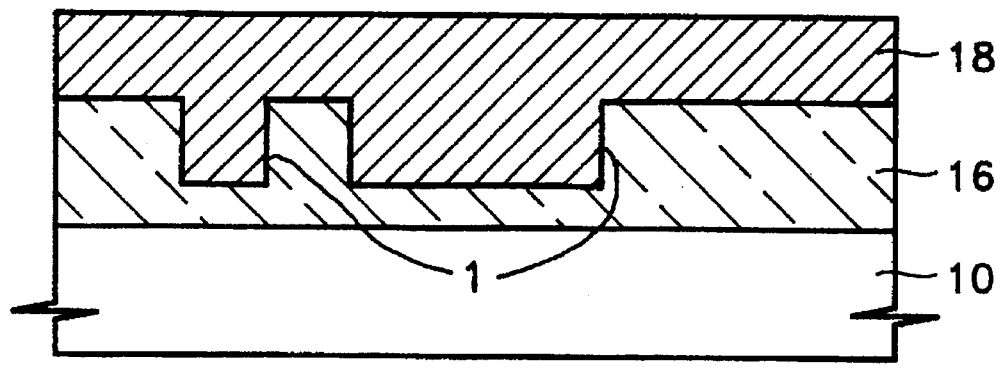
Figure 2C:
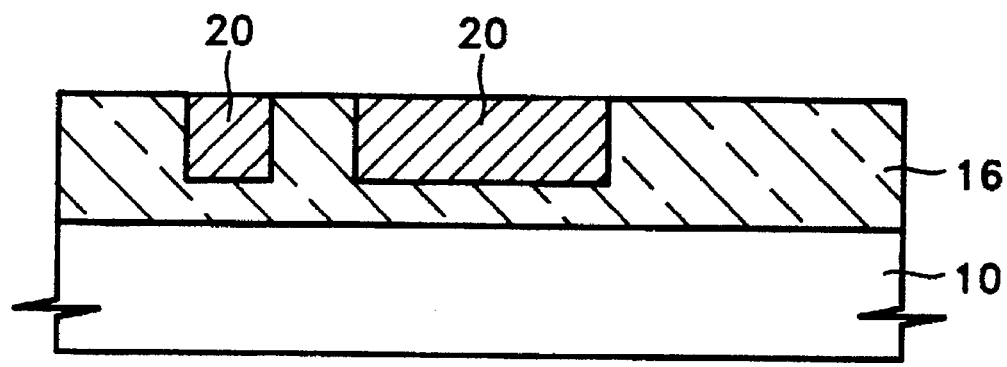
Figure 3A:
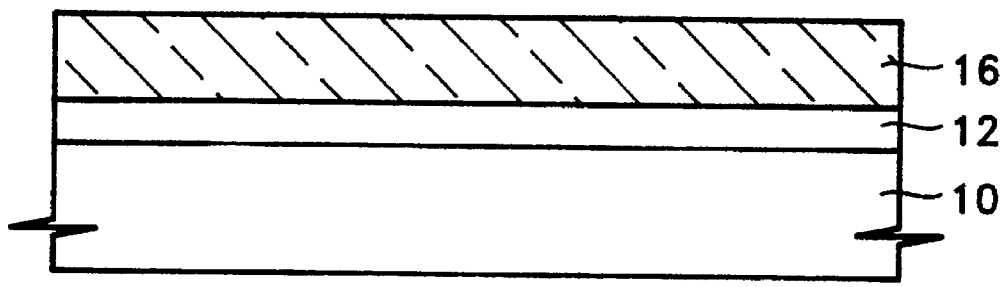
FIGS. 3A through 3C are sectional views for sequentially illustrating a method for forming a conductive line according to the first embodiment of the present invention.

A method for forming a conductive line according to the first embodiment of the present invention will now be explained with reference to FIGS. 3A through 3C.

Insulating material such as silicon dioxide or borophosphorus silicate glass (BPSG) is coated on a semiconductor substrate 10 to form first insulating layer 12. SiOF layer 16 is then formed on the overall surface of the resultant substrate (FIG. 3A).

SiOF layer 16 in the regions where conductive lines to be formed is etched thereby forming trenches 1. Thereafter, insulating material such as silicon dioxide or BPSG is coated on the overall surface of the resultant substrate, for example, by using plasma chemical vapor deposition (plasma CVD), thermal chemical vapor deposition (thermal CVD), or some other coating process to form second insulating layer 22. Then, for example, aluminum-containing conductive material 18 is deposited on the overall surface of the resultant substrate (FIG. 3B).

Conductive material 18 (shown in FIG. 3B) is etched back until the surface of SiOF layer 16 is exposed and thus conductive material is plugged into trenches 1 to form conductive lines 20. Insulating material such as silicon dioxide or BPSG is then coated on the resultant substrate to form a third insulating layer 24 (FIG. 3C).

According to the first embodiment of the present invention, second insulating layer 22 is formed on the inner walls of trenches 1 and thus SiOF layer 16 is prevented from directly contacting with conductive lines 20, so that conductive lines 20 can be free from corrosion. Also, SiOF layer 16 is formed on the flat surface of first insulating layer 12, thereby preventing deterioration of the dielectric layer which results from uneven distribution of fluorine in SiOF layer 16.

In this embodiment, the step of etching back the conductive material is carried out by chemical mechanical polishing (CMP) process, which is disclosed in U.S. Pat. No. 5,137,597 (Title of the Invention: FABRICATION OF METAL FILLARS IN AN ELECTRONIC COMPONENT USING POLISHING, Inventors: John W. Curry II et al.).

Second Embodiment

Figure 4:
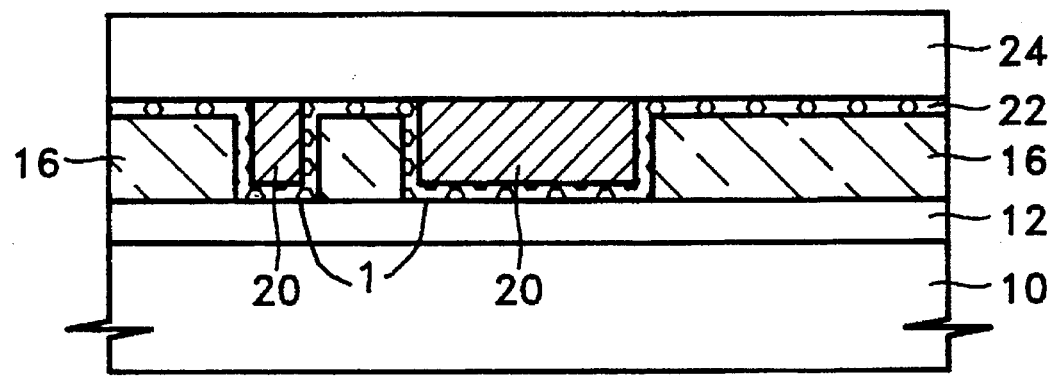
FIG. 4 is a sectional view of a conductive line formed by the second embodiment of the present invention.

FIG. 4 is a sectional view of a conductive line formed in accordance with the second embodiment of the present invention.

Figure 3B:
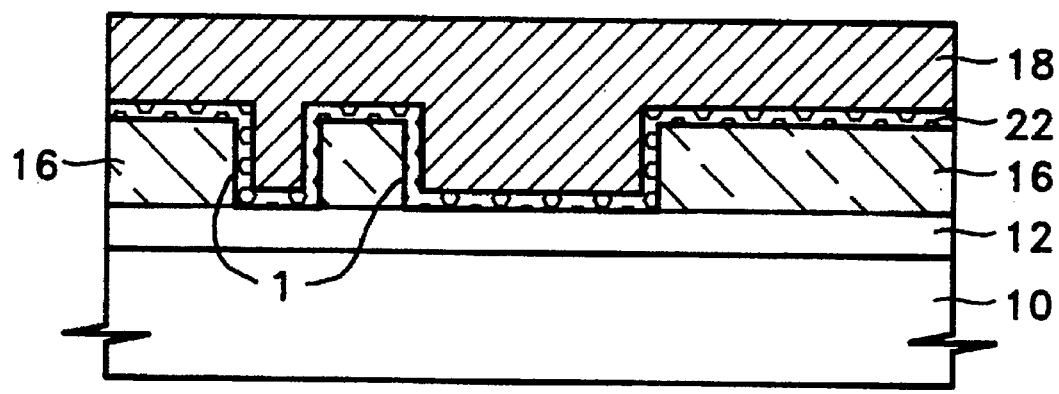
Figure 3C:
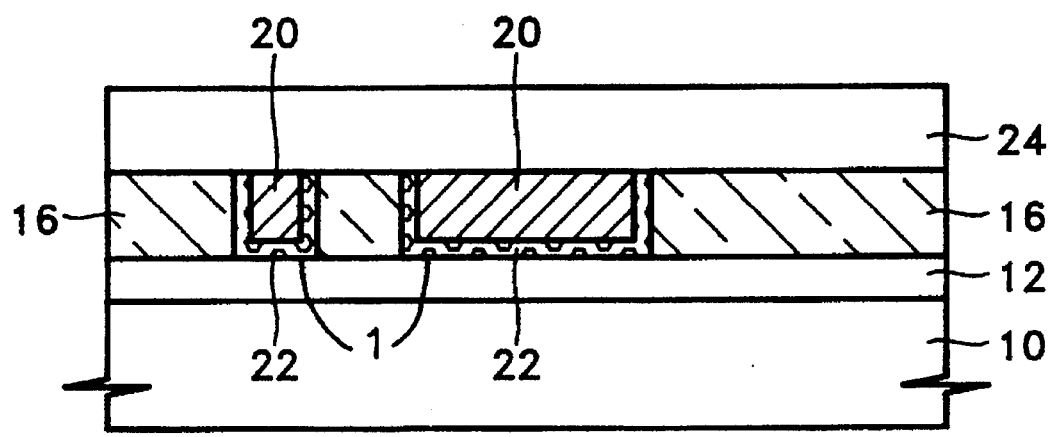

In this embodiment, the same processes as the first embodiment are repeated, except for leaving second insulating layer 22 formed on SiOF layer 16 during the step of etching back conductive material 18 (shown in FIG. 3B).

Third Embodiment

Figure 5A:
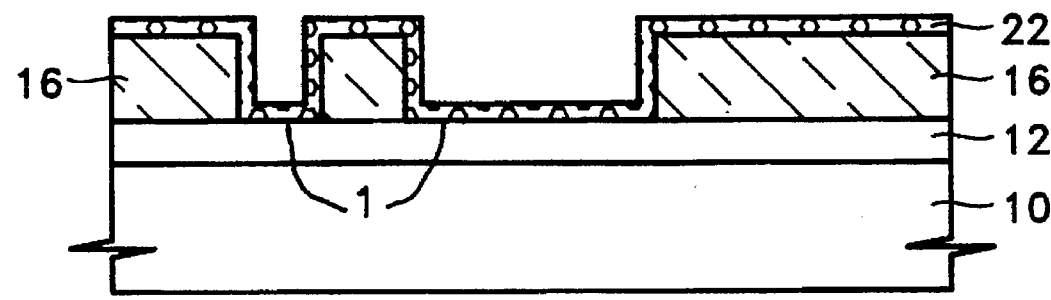
FIGS. 5A through 5C are sectional views for sequentially illustrating a method for forming a conductive line according to the third embodiment of the present invention.
Figure 5B:
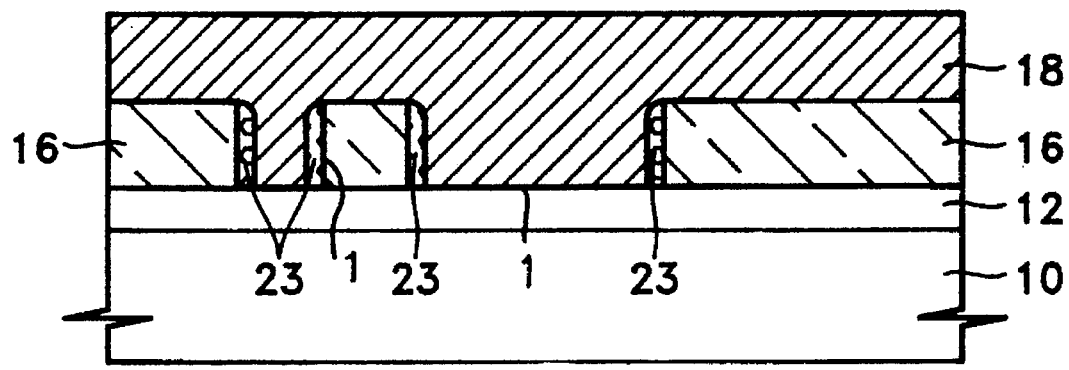
Figure 5C:
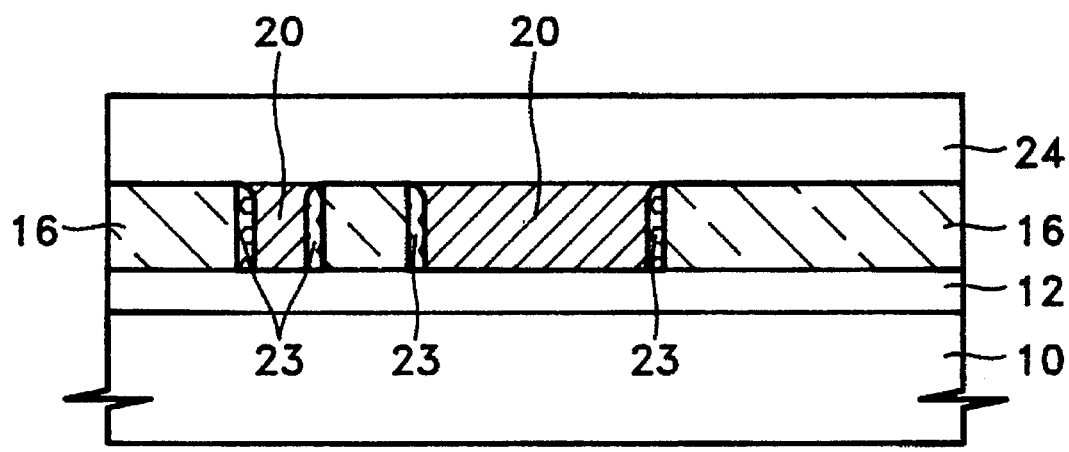

FIGS. 5A through 5C sequentially illustrate a method for forming a conductive line according to the third embodiment of the present invention. In this embodiment, a spacer 23 which is made of the second insulating layer is formed on the side wall of trench 1, thereby preventing SiOF layer 16 from contacting with conductive line 20.

The first embodiment is repeated up to the step of forming second insulating layer 22 (FIG. 5A). Thereafter, second insulating layer 22 is anisotropically etched to form spacer 23 which is made of the second insulating layer on the side wall of trench 1. Aluminum-containing conductive material 18 is for example, then deposited on the overall surface of the resultant substrate (FIG. 5B).

Thereafter, the conductive material 18 (shown in FIG. 5B) is etched back by the CMP until SiOF layer 16 is exposed to form conductive line 20 in such a manner that the conductive material plugs trench 1. Third insulating layer 24 is then formed on the overall surface of the resultant substrate by the same process as in the first embodiment (FIG. 5C).

Fourth Embodiment

Figure 6A:
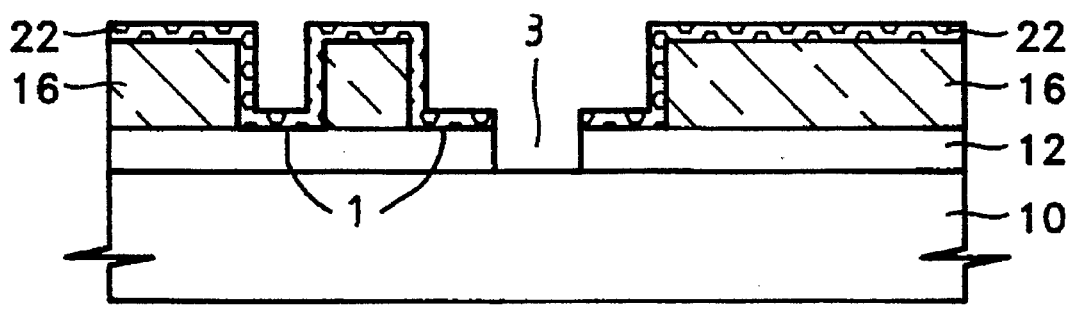
FIGS. 6A through 6C are sectional views for sequentially illustrating a method for forming a conductive line according to the fourth embodiment of the present invention.
Figure 6B:
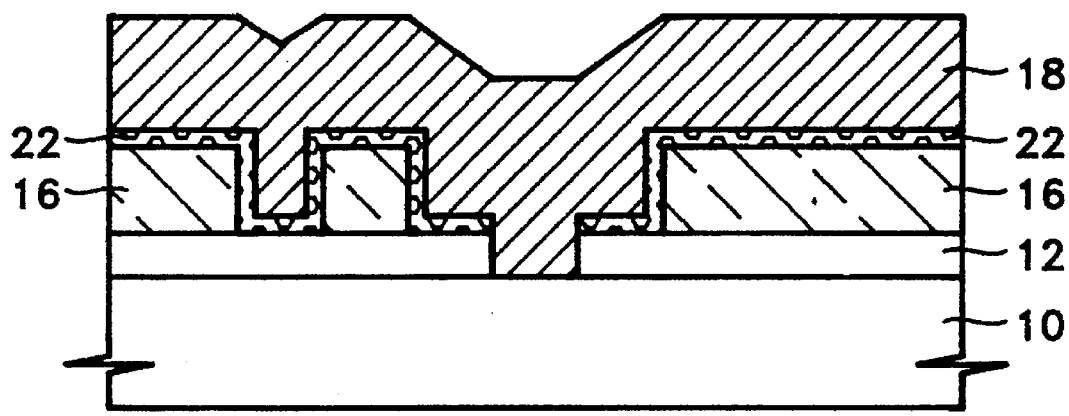
Figure 6C:
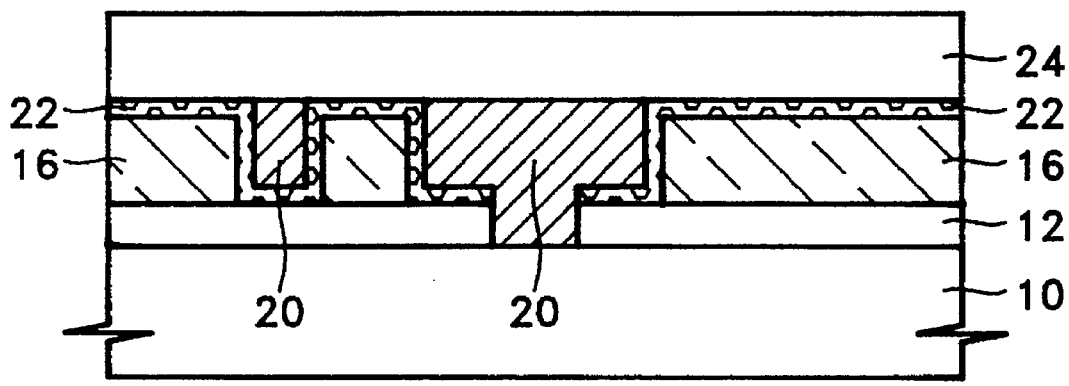

FIGS. 6A through 6C sequentially illustrate a method for forming a conductive line according to the fourth embodiment of the present invention, in which conductive line 20 may be connected to a lower conductive material (not shown).

The first embodiment is repeated up to the step of forming second insulating layer 22. Material formed on a region which is connected to a lower conductive material, for example an impurity layer, is removed to form contact hole 3. Contact hole 3 should be formed inside trench 1 (FIG. 6A).

After depositing aluminum-containing conductive material 18 on the overall surface of the resultant substrate (FIG. 6B), conductive material 18 is etched back by the CMP until second insulating layer 22 is exposed. In the process conductive line 20 is formed which connects to the lower conductive line or the impurity layer (not shown) by plugging into trench 1 and contact hole 3. At this time, second insulating layer 22 coated on SiOF layer 16 may be removed by the above mentioned etch back process. Thereafter, third insulating layer 24 is formed on the overall surface of the resultant substrate by the same process as in the first embodiment (FIG. 6).

In this embodiment, a contact hole 3 is formed inside trench 1, thereby connecting the conductive line 20 to the lower conductive material (not shown).

Fifth Embodiment

FIGS. 7A through 7D sequentially illustrate a method for forming a conductive line according to the fifth embodiment of the present invention, in which another method for connecting conductive line 20 to the lower conductive material (not shown) is shown.

Figure 7A:
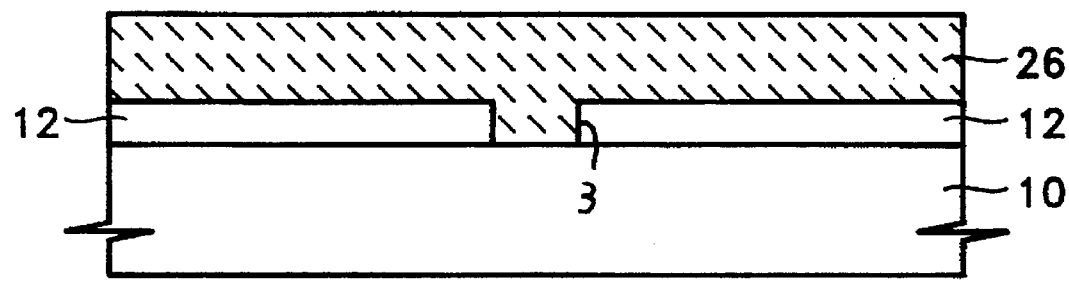
FIGS. 7A through 7D are sectional views for sequentially illustrating a method for forming a conductive line according to the fifth embodiment of the present invention.

After forming first insulating layer 12 flat on semiconductor substrate 10 in which an impurity layer (not shown) is formed or on which a lower conductive line (not shown) is formed by the same process as in the first embodiment, a region of first insulating layer 12 where a contact hole is to be formed is removed to form contact hole 3. Then, first conductive material 26 such as tungsten (W), aluminum (Al), tungsten nitride (WN), titanium (Ti) or titanium nitride (TiN) is deposited on the overall surface of the resultant substrate (FIG. 7A).

Figure 7B:
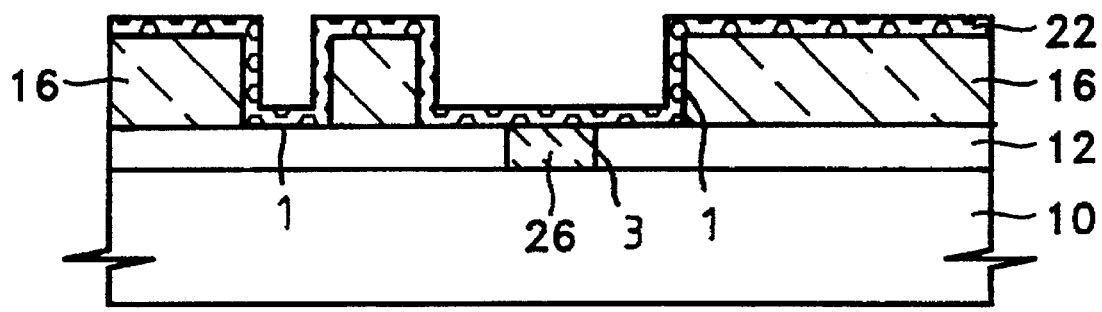

First conductive material 26 is etched back by the CMP until first insulating layer 12 is exposed, thereby plugging contact hole 3 with first conductive material 26. Then, after forming SiOF layer 16 on the overall surface of the resultant substrate, second insulating layer 22 is formed by the same process as in the first embodiment (FIG. 7B).

Figure 7C:
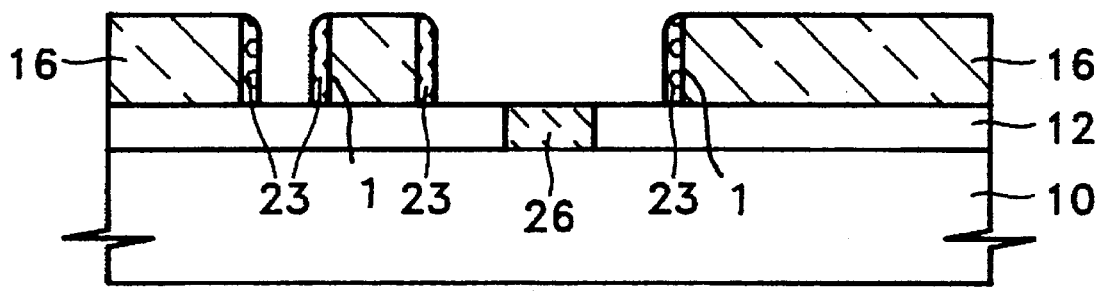

Second insulating layer 22 is anisotropically etched to form spacer 23 on the inner wall of trench 1, thereby exposing first conductive material 26 plugged into contact hole 3 (FIG. 7C).

Figure 7D:
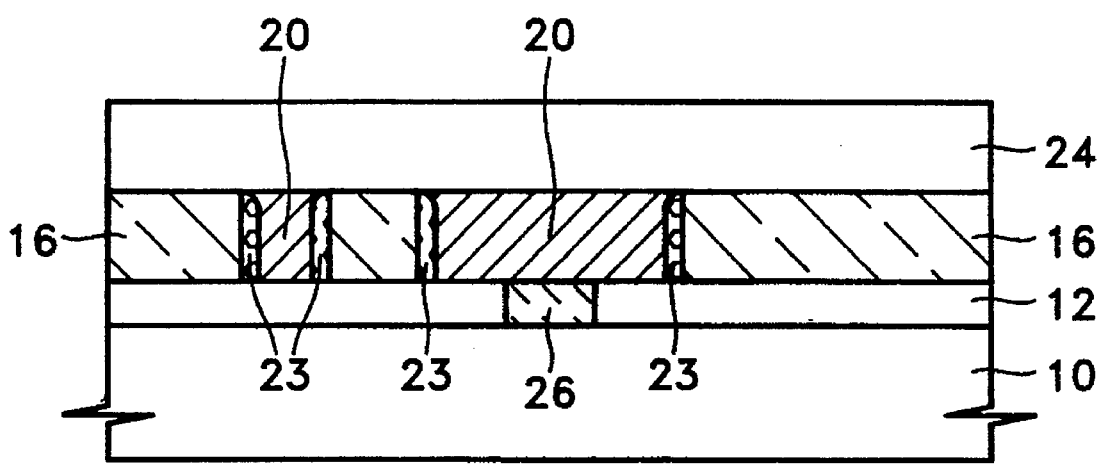

Then, after the same process as the first embodiment is repeated to form conductive line 20 plugged into trench 1, third insulating layer 24 is formed (FIG. 7D).

According to the method for forming a conductive line of the present invention, the insulation effect is improved by the use of SiOF which is dielectric material with a low dielectric constant as a layer for insulating between the conductive lines, the SiOF layer's characteristic is improved by forming the SiOF layer on a flat surface, and the conductive line is free from corrosion by interposing the insulating layer between the SiOF layer and the aluminum-containing conductive line.

The present invention is not limited to the above embodiments and many other variations will be readily available to those skilled in this art.

What is claimed is:

1. A method for forming a conductive line of a semiconductor device, comprising the steps of:
   (a) providing a lower structure;
   (b) forming a fluoride doped oxide layer on said lower structure;
   (c) etching said fluoride doped oxide layer in a region where a conductive line is to be formed to form a trench;
   (d) forming an insulating layer on a surface of said oxide layer and on a surface of said trench;
   (e) depositing conductive material on said insulating layer and in said trench; and
   (f) etching said conductive material so that said conductive material is left only in said trench to form a conductive line.

2. A method for forming a conductive line of a semiconductor device as claimed in claim 1, wherein the etch back process of said step (f) is performed by a chemical mechanical polishing process.

3. A method for forming a conductive line of a semiconductor device as claimed in claim 1, wherein the etch back process of said step (f) is performed until a surface of said insulating layer is exposed.

4. A method for forming a conductive line of a semiconductor device as claimed in claim 1, wherein the etch back process of said step (f) is performed until a surface of said fluorine doped oxide layer is exposed.

5. A method for forming a conductive line of a semiconductor device as claimed in claim 1, wherein said lower structure that the insulating material layer is formed on is one of a semiconductor substrate on which a lower conductive line is formed and a semiconductor substrate in which an impurity layer is formed.

6. A method for forming a conductive line of a semiconductor device as claimed in claim 5, said method further comprising the step of, after said step (d), partially etching said insulating material layer underlying said trench to expose one of said lower conductive line and said impurity layer.

7. A method for forming a conductive line of a semiconductor device as claimed in claim 1, wherein said conductive material is a material which reacts with said fluorine doped oxide layer to cause corrosion.

8. A method for forming a conductive line of a semiconductor device as claimed in claim 7, wherein said conductive material is aluminum.

9. A method for forming a conductive line of a semiconductor device as claimed in claim 1, wherein said insulating layer is one selected from the group consisting of silicon dioxide and boro-phosphorus doped silicate glass.

10. A method for forming a conductive line of a semiconductor device, comprising the steps of:
   (a) providing a lower structure;
   (b) forming a fluoride doped oxide layer on said lower structure;
   (c) etching said fluoride doped oxide layer in a region where a conductive line is to be formed to form a trench;
   (d) forming an insulating layer on a surface of said fluoride doped oxide layer and on a surface of said trench;
   (e) anisotropically etching said insulating layer to form a spacer on a side wall of said trench;
   (f) depositing conductive material on said fluoride doped oxide layer and in said trench; and (g) etching said conductive material so that said conductive material is left only in said trench to form a conductive line.

11. A method for forming a conductive line of semiconductor device, comprising the steps of:
   (a) providing a lower structure, the lower structure being one of a semiconductor substrate on which a lower conductive line is formed and a semiconductor substrate in which an impurity layer is formed;
   (b) forming an insulating material layer on the lower structure;
   (c) forming a contact hole for exposing one of said lower conductive line and said impurity layer;
   (d) depositing a first conductive material on a surface of said insulating material layer and in said contact hole;
   (e) etching said first conductive material to form a plug layer which fills said contact hole;
   (f) forming a fluoride doped oxide layer on surfaces of said insulating material layer and said plug layer;
   (g) etching said fluoride doped oxide layer to form a trench and to expose said plug layer;
   (h) forming an insulating layer on a surface of said fluoride doped oxide layer and on a surface of said trench;
   (i) anisotropically etching said insulating layer to form a spacer on a side wall of said trench;
   (j) depositing a second conductive material on said fluoride doped oxide layer and in said trench; and
   (k) etching said second conductive material so that said second conductive material is left only in said trench to form a conductive line.

12. A method for forming a conductive line of a semiconductor device as claimed in claim 11, wherein said first conductive material is one selected from the group consisting of tungsten, aluminum, tungsten nitride, titanium and titanium nitride.

13. A method for forming a conductive line of a semiconductor device as claimed in claim 11, wherein said second conductive material is a material which reacts with the oxide layer to cause corrosion.

14. A method for forming a conductive line of a semiconductor device as claimed in claim 13, wherein said second conductive material is aluminum.

* * * * *